United States Patent
Xi

(10) Patent No.: US 6,909,252 B2
(45) Date of Patent: *Jun. 21, 2005

(54) PRE-DRIVE CIRCUIT FOR BRUSHLESS DC SINGLE-PHASE MOTOR

(75) Inventor: Junnan Xi, Miyota-machi (JP)

(73) Assignee: Minebea Co., Ltd., Kitasaku-gun (JP)

( * ) Notice: Subject to any disclaimer, the term of this patent is extended or adjusted under 35 U.S.C. 154(b) by 0 days.

This patent is subject to a terminal disclaimer.

(21) Appl. No.: 10/811,970

(22) Filed: Mar. 30, 2004

(65) Prior Publication Data

US 2004/0178753 A1 Sep. 16, 2004

Related U.S. Application Data

(63) Continuation of application No. 10/265,717, filed on Oct. 8, 2002, now abandoned.

(30) Foreign Application Priority Data

Oct. 25, 2001 (JP) ........................................ 2001-327629

(51) Int. Cl.[7] ................................................ H02P 1/18
(52) U.S. Cl. ...................... 318/254; 318/138; 318/439; 318/293; 318/294; 388/907.2; 361/91.1
(58) Field of Search ................................ 318/254, 138, 318/439, 432, 434, 257, 293, 294; 361/91.1, 91.5; 388/907.2, 907.5

(56) References Cited

U.S. PATENT DOCUMENTS

| | | | |
|---|---|---|---|
| 4,379,984 A | 4/1983 | Muller | |
| 4,535,275 A | 8/1985 | Muller | |
| 4,594,650 A * | 6/1986 | Kinbara | 363/56.05 |
| 4,633,358 A | 12/1986 | Nagano | |
| 4,786,822 A | 11/1988 | Steely | |
| 4,989,127 A * | 1/1991 | Wegener | 363/16 |
| 5,349,275 A | 9/1994 | Muller | |
| 5,408,150 A * | 4/1995 | Wilcox | 327/108 |
| 5,642,247 A * | 6/1997 | Giordano | 361/31 |
| 5,703,447 A * | 12/1997 | Higuchi | 318/139 |
| 5,859,519 A | 1/1999 | Archer | |
| 6,078,154 A | 6/2000 | Manlove et al. | |
| 6,124,751 A | 9/2000 | Pidutti | |
| 6,713,906 B2 * | 3/2004 | Xi | 310/66 |

* cited by examiner

Primary Examiner—Rina Duda
(74) Attorney, Agent, or Firm—Oliff & Berridge, PLC

(57) ABSTRACT

A pre-drive circuit for a brushless DC single-phase motor permits a cost reduction and an easy adjustment for the control input voltage of a switching device adjacent to a power source in a wider range, especially in increasing the control input voltage. In a drive circuit having four switching devices making up an H-bridge circuit with a motor coil being sandwiched therebetween, a control voltage exceeding a power supply voltage is required to turn ON the switching devices adjacent to the power source. The pre-drive circuit changes the duty ratio of the control voltage controlling motor speed. A circuit unit for generating pulse signals for controlling the switching devices uses an inexpensive logic circuit. Drive circuits receiving step-up voltages to amplify the pulse signals for controlling the switching devices adjacent to the power source to a level exceeding the power supply voltage and supplying the amplified pulse signals to the control input terminals of the switching devices adjacent to the power source are separately configured from peripheral circuits.

11 Claims, 3 Drawing Sheets

PRE-DRIVE CIRCUIT FOR BRUSHLESS DC SINGLE-PHASE MOTOR

This is a continuation of application Ser. No. 10/265,717 filed Oct. 8, 2002 now abandoned. The entire disclosure of the prior application is hereby incorporated by reference herein in its entirety.

BACKGROUND OF THE INVENTION

1. Field of the Invention

The present invention relates to a brushless DC single-phase motor ideally used as a fan motor for exhausting the heat generated in a cabinet of electronic equipment to the outside. More particularly, the present invention relates to a pre-drive circuit for applying control signals to a switching device of a drive circuit of the brushless DC single-phase motor.

2. Description of the Related Art

In electronic equipment, including office automation equipment, typically represented by a personal computer and copying machine, that accommodates a number of electronic parts in a relatively small cabinet, the heat generated from the electronic parts is confined in the cabinet, leading to a danger of the electronic parts being thermally damaged.

To solve such a problem, a vent hole is provided in a wall surface or a ceiling surface of the cabinet of such electronic equipment, and a fan motor is installed at the vent hole so as to exhaust the heat in the cabinet to the outside.

For such a fan motor, a brushless DC single-phase motor is used frequently. A conventional pre-drive circuit for the brushless DC single-phase motor will be described with reference to FIG. 3.

Referring to FIG. 3, the pre-drive circuit is defined by the section of the brushless DC single-phase motor excluding a coil (motor coil) L1 and a drive circuit 31 therefor. Vcc denotes a DC power source for operating the circuit.

As shown in the drawing, the drive circuit 31 is constituted by four switching devices, namely, n-channel MOS power field-effect transistors (FETs) PF1 through PF4, a diode D31, and a capacitor C31.

The coil L1 is provided on a stator (not shown) of the motor, and energized at a predetermined ON/OFF timing by the four power FETs PF1 through PF4 of the drive circuit 31, which drives the coil L1, so as to produce a dynamic magnetic field or a rotating magnetic field.

A rotor (not shown) of the motor is provided with a permanent magnet, and rotated as the permanent magnet rotates, following the magnetic field.

The pre-drive circuit is constructed of dedicated integrated circuits IC1 and IC2, resistors R31 through R35, capacitors C32 through C35, and diodes D32 through D35. The power FETs, PF1 through PF4, have parasitic diodes, as shown in the drawing.

In the following descriptions, the dedicated integrated circuits IC1 and IC2 will be referred to simply as the dedicated IC1 and IC2, and the power FETs, PF1, PF2, PF3, and PF4, will be referred to simply as PF1, PF2, PF3, and PF4.

The dedicated IC1 receives a rotational position signal x of a motor, i.e., a rotor or permanent magnet, detected by a Hall element or the like (not shown), a high-level signal y for shutdown, and a duty ratio setting signal z for controlling the rotational speed of the motor. The dedicated IC1 is subjected to a step-up voltage VB1, which will be discussed hereinafter, to turn ON or OFF the PF1 and PF3 at timings set on the basis of the signals x, y, and z.

The signals x, y, and z are also supplied to the dedicated IC2. Upon receipt of a step-up voltage VB2, which will be discussed hereinafter, the dedicated IC2 turns ON or OFF the PF2 and PF4 at timings set on the basis of the signals x, y, and z.

Of the PF1 through PF4 connected as illustrated, the PF3 and PF4 turn ON if the potentials of their gates, i.e., control input terminals, are slightly higher than a ground potential, because their sources are grounded. The PF1 and PF2 are adjacent to a power source Vcc with the coil L1 installed therebetween. Hence, in a normal mode wherein the drive voltage of the coil L1 is substantially equal to a power supply voltage (Vcc), a voltage exceeding the power supply voltage must be applied to their gates. In other words, a voltage obtained by adding the gate-source voltage required for turning the PF1 and PF2 ON to the power supply voltage must be applied to the gates.

Capturing such voltage higher than the power supply voltage from outside inevitably adds to the complication and size of a power supply circuit, as well as higher cost. For this reason, it is usually desired to obtain such a voltage within the pre-drive circuit itself.

As a solution to the above problem, a step-up circuit, such as a charge pump circuit, is added. Each of the circuit constituted by the diode D32, the capacitor C34, and the resistor R31, and the circuit constituted by a diode D33, the capacitor C35, and the resistor R31 makes up the charge pump circuit.

In this case, a step-up voltage VB1 from a connection point of the diode D32 and the capacitor C34 is applied to the dedicated IC1 as a step-up voltage VB for turning the PF1 ON. Similarly, a step-up voltage VB2 from a connection point of the diode D33 and the capacitor C35 is applied to the dedicated IC2 as a step-up voltage VB for turning the PF2 ON.

Thus, the dedicated IC1 supplies a high-voltage pulse signal HO based on the voltage VB to the gate of the PF1 at a predetermined ON/OFF timing. Similarly, the dedicated IC2 supplies the high-voltage pulse signal HO based on the voltage VB to the gate of the PF2 at a predetermined ON/OFF timing. On the other hand, low-voltage pulse signals LO based on the power supply voltage (Vcc) are supplied from the dedicated IC1 and IC2 to the gates of the PF3 and PF4 at predetermined ON/OFF timings.

The ON/OFF timings are set in the dedicated IC1 and IC2 on the basis of the signals x, y, and z. The signals from the dedicated IC1 and IC2 cause the PF1 through PF4 to turn ON or OFF at predetermined timings and duty ratios so as to control the energization of the coil L1.

Thus, the motor, i.e., the rotor, rotates in a predetermined direction at a speed based on the signals x, y, and z. If the motor is equipped with a fan and installed at the vent hole in the cabinet of electronic equipment, then the motor operates as a fan motor to exhaust the heat in the cabinet to the outside.

The conventional circuit, however, uses the dedicated IC1 and IC2, which are costly.

Furthermore, the use of the dedicated IC1 and IC2 restricts the gate voltages of the PF1 and PF2 adjacent to the power source to the values within a fixed range.

To be more specific, as mentioned above, the gate voltages of the PF1 and PF2 must be higher than the power supply voltage. The voltages are obtained by a charge pump circuit or the like, and applied to the gates of the PF1 and PF2 by the dedicated IC1 and IC2 on the basis of the voltages applied as the step-up voltages VB1 and VB2 to the VB terminals, namely, the step-up voltage input terminals, of the dedicated IC1 and IC2. However, the ICs, namely, the dedicated IC1 and IC2, are housed in a single package, and the circuit configuration therein is fixed. This means that the range of the step-up voltages VB1 and VB2 applied to the VB terminals of the PF1 and PF2, i.e., the range wherein the gate voltages of the PF1 and PF2 can be changed, depends on the specifications of the ICs, and therefore cannot be arbitrarily changed.

Hence, the degree of freedom in the circuit design involving the ICs is unavoidably limited, making it impossible to permit flexible circuit design that involves, for example, a change of a motor to be driven, a change of the rated drive voltage of the motor coil L1, or a change of the power FETs (the PF1 through PF4) themselves, that would cause a change in the gates voltages of the PF1 and PF2. Especially if a change is made to increase the gate voltages (step-up voltages) of the PF1 and PF2, failure to pay attention to the rating of the step-up voltage input terminals when applying the increased voltages would present a problem of damaging the dedicated IC1 and IC2.

SUMMARY OF THE INVENTION

The present invention has been made with a view toward solving the problem described above, and it is an object of the invention to provide a pre-drive circuit for a brushless DC single-phase motor that can be constructed at low cost, and permits the control input voltage of a switching device adjacent to a power source to be easily changed or adjusted in a wider range without causing damage to a circuit element even when a change is made to increase the control input voltage.

To this end, according to the present invention, there is provided a pre-drive circuit for a brushless DC single-phase motor having a drive circuit in which a pair of series connected units, each series connected unit being constituted by two switching devices, is connected between a power source and the ground, a motor coil connected between the junctions of the two switching devices of the pair of series connected units can be controllably energized/de-energized from any direction at any timing by controlling the turning ON/OFF of the switching devices, a control voltage exceeding a power supply voltage is required to turn ON the two switching devices adjacent to a power source, and a duty ratio of a turning ON/OFF control voltage applied to the switching devices is changed to control the rotational speed of the motor, the pre-drive circuit including: a step-up circuit for boosting a power supply voltage to a predetermined voltage; a logic circuit for generating and outputting pulse signals for controlling the switching devices on the basis of a motor rotational position signal and a duty ratio setting signal for controlling a motor rotational speed; two switching device drive circuits adjacent to the power source that are respectively connected to pulse signal output terminals for controlling the two switching devices adjacent to the power source of the logic circuit, respectively receive step-up voltages from the step-up circuit as operating power sources, respectively amplify the pulse signals for controlling the two switching devices adjacent to the power source to a predetermined voltage level exceeding the power supply voltage, and respectively supply the amplified pulse signals to control input terminals of the two switching devices adjacent to the power source; and two switching device drive circuits adjacent to the ground that are respectively connected to the pulse signal output terminals for controlling the two switching devices adjacent to the ground of the logic circuit, respectively receive voltages that are the power supply voltage or less as operating power sources, respectively amplify the pulse signals for controlling the two switching devices adjacent to the ground as necessary, and supply the amplified pulse signals to the control input terminals of the two switching devices adjacent to the ground.

Preferably, the step-up circuit includes a potentiometer that allows the step-up voltage to be set by setting a resistance value. A desired step-up voltage is obtained by setting the resistance value of the potentiometer on the basis of a control voltage value required for turning ON the two switching devices adjacent to the power source.

Preferably, the switching device drive circuit adjacent to the power source has a resistor and an NPN transistor and a PNP transistor that are connected in series in a forward direction through the intermediary of the resistor. The bases of the two transistors are commonly connected to the output terminals of the pulse signals for controlling the switching devices, which are adjacent to the power source, of the logic circuit, while the end of the resistor adjacent to the ground is connected to the control input terminal of the switching device adjacent to the power source.

Preferably, the switching device drive circuit adjacent to the ground has a resistor and an NPN transistor and a PNP transistor that are connected in series in a forward direction through the intermediary of the resistor. The bases of the two transistors are commonly connected to the output terminals of the pulse signals for controlling the switching devices, which are adjacent to the ground, of the logic circuit, while the end of the resistor adjacent to the ground is connected to the control input terminal of the switching device adjacent to the ground.

Preferably, the pre-drive circuit for a brushless DC single-phase motor further includes an overvoltage protection circuit for restraining an overvoltage between the control input terminal of the switching device adjacent to the power source and the switching end, which is adjacent to a motor coil, of a pair of switching ends of the switching device.

DESCRIPTION OF THE PREFERRED EMBODIMENTS

An embodiment of the present invention will now be described with reference to the accompanying drawings.

Figure 1:
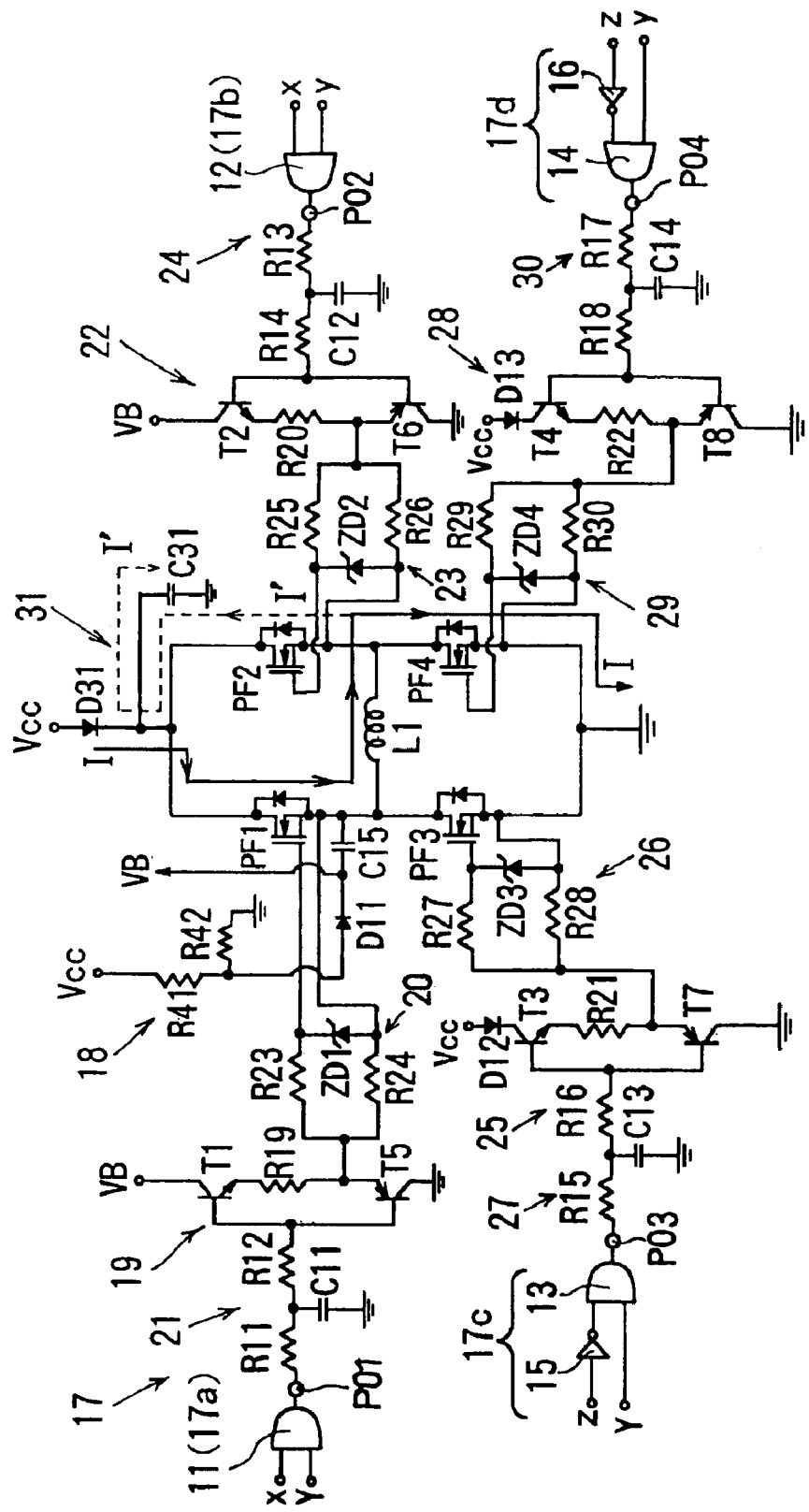
FIG. 1 is a circuit diagram showing an embodiment in accordance with the present invention.

FIG. 1 is a circuit diagram showing a drive circuit for a brushless DC single-phase motor in accordance with an embodiment of the present invention.

A pre-drive circuit is defined by the portion of the circuit shown in FIG. 1 that excludes a coil, namely, a motor coil, L1 of the brushless DC single-phase motor, and a drive circuit 31. Vcc denotes a DC power source for operating the circuit. In this example, the operating power source of the coil L1 comes from the power source Vcc; alternatively however, a separate power source may be provided for operating the coil L1.

The drive circuit 31 is constituted by four switching devices, namely, n-channel MOS power field-effect transistors (FETs) PF1 through PF4, a diode D31, and a capacitor C31, as shown in the diagram.

The four power FETs PF1 through PF4 are divided into two power FET series connected units (a series connected unit constructed of the PF1 and PF3, and another series connected unit constructed of the PF2 and PF4). The connected units are respectively connected between the power source Vcc and the ground, the polarities thereof being as illustrated. The diode D31 is connected between the power source Vcc and the two series connected units (the series connected unit of the PF1 and PF3, and the series connected unit of PF2 and PF4) in the forward direction with respect to the power source Vcc. The capacitor C31 is connected between the cathode of the diode D31 and the ground. The coil L1, which is to be driven, is connected between the connection point of the PF1 and the PF3 and the connection point of the PF2 and PF4.

The coil L1 is provided on a stator of the motor (not shown), and energized by the PF1 through PF4 at predetermined ON/OFF timings to produce a dynamic magnetic field or a rotating magnetic field.

A rotor (not shown) of the motor is equipped with a permanent magnet, and rotated as the permanent magnet rotates, following the magnetic field.

The pre-drive circuit in accordance with the present invention is constructed of a logic circuit 17 (17a through 17d) including, for example, four AND circuits 11 through 14 and two inverter circuits 15 and 16, resistors R11 through R30, R41 and R42, capacitors C11 through C15, diodes D11 through D13, zener diodes ZD1 through ZD4, NPN transistors T1 through T4, and PNP transistors T5 through T8. The power FETs, PF1 through PF4, have parasitic diodes, as shown in the drawing.

Figure 3:
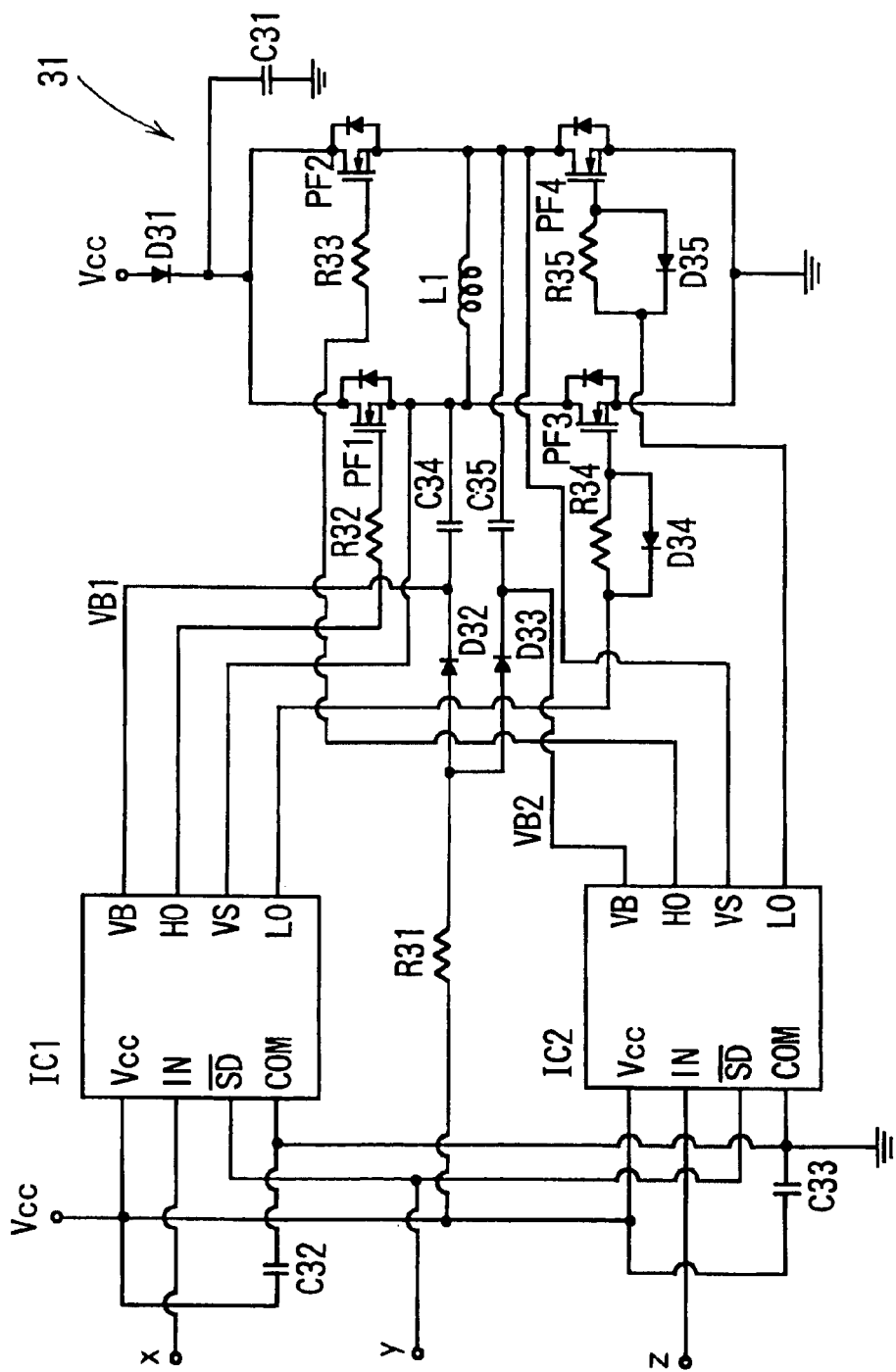
FIG. 3 is a circuit diagram showing a conventional circuit.

Based on signals x, y, and z similar to those shown in FIG. 3, the logic circuit 17 outputs signals (voltage waveforms) similar to the signals output from the dedicated IC1 and IC2 shown in FIG. 3 so as to turn ON/OFF the PF1 through PF4 at the timings set on the basis of the signals x, y, and z. In this embodiment, the logic circuit 17 is constituted by a general-purpose IC that includes four or more AND circuits and two or more inverter circuits.

As previously mentioned, of the PF1 through PF4 connected as illustrated, the PF3 and PF4 have their sources grounded, so that they turn ON if the gates serving as control input terminals have a slightly higher potential than the ground potential. The PF1 and PF2 are located adjacently to the power source Vcc with the coil L1 provided therebetween. Hence, in a normal mode wherein the drive voltage of the coil L1 is substantially equal to a power supply voltage (Vcc), a voltage exceeding the power supply voltage must be applied to their gates. In other words, a voltage obtained by adding the gate-source voltage required for turning the PF1 and PF2 ON to the power supply voltage must be applied to the gates. Capturing such voltage higher than the power supply voltage from outside inevitably adds to the complication and size of a power supply circuit, as well as higher cost. For this reason, it is usually desired to obtain such a voltage within the pre-drive circuit itself.

As a solution to the above problem, a step-up circuit, such as a charge pump circuit, is added. A charge pump circuit 18 formed of a diode D11, a capacitor C15, and resistors R41 and R42 (potentiometer) constitutes the charge pump circuit.

More specifically, in the charge pump circuit 18 according to this embodiment, a resistor R41, a forward diode D11, and a capacitor C15 are connected in this order from the power source Vcc between the power source Vcc and the source of the PF1, and a resistor R42 is connected between the connection point of the resistor R41 and the diode D11 and the ground.

According to the charge pump circuit 18, if the resistance values of the resistors R41 and R42 making up the potentiometer are denoted as R41 and R42, and the voltage value of the power source Vcc is denoted as Vcc, then a step-up voltage VB obtained by $\{R42/(R41+R42)\} \cdot Vcc$ is output from the connection point of the diode D11 and the capacitor C15.

The transistors T1 and T5 and a resistor R19, and transistors T2 and T6 and a resistor R20 constitute PF drive circuits 19 and 22, respectively, adjacent to the power source. The PF drive circuits 19 and 22 amplify pulse signals for controlling the two PFs adjacent to the power source to a predetermined voltage level exceeding a power supply voltage Vcc, that is, at least a voltage level at which the PF1 and PF2 adjacent to the power source can be turned ON.

To be more specific, in the PF drive circuit 19 adjacent to the power source, the transistors T1 and T5 connected in series in the forward direction through the intermediary of the resistor R19 are interposed between a DC power source terminal VB, to which the step-up voltage VB is applied, and the ground. In this case, the bases of the two transistors T1 and T5 are commonly connected to a terminal PO1 for outputting pulse signals for controlling the PF1 adjacent to the power source of the logic circuit 17a. The end of the resistor R19 that is adjacent to the ground, i.e., the point between the resistor R19 and the emitter of the transistor T5, is connected to the gate of the PF1 adjacent to the power source (the control input terminal).

In this embodiment, the end of the resistor R19 that is adjacent to the ground is connected to the gate of the PF1 adjacent to the power source through the intermediary of an overvoltage protection circuit 20 for the gate-source of the PF1 adjacent to the power source, which is constituted by resistors R23 and R24 and a zener diode ZD1. The commonly connected bases of the transistors T1 and T5 are connected to the terminal PO1 for outputting pulse signals through the intermediary of a noise protection filtering circuit 21 formed of resistors R12 and R11 and a capacitor C11.

In a PF drive circuit 22 adjacent to the power source, the transistors T2 and T6 connected in series in the forward direction through the intermediary of a resistor R20 are interposed between the DC power source terminal VB, to which the step-up voltage VB is applied, and the ground. In this case, the bases of the two transistors T2 and T6 are commonly connected to a terminal PO2 for outputting pulse signals for controlling the PF2 adjacent to the power source of the logic circuit 17b. The end of the resistor R20 that is adjacent to the ground, i.e., the point between the resistor R20 and the emitter of the transistor T6, is connected to the gate of the PF2 adjacent to the power source.

In this embodiment, the end of the resistor R20 that is adjacent to the ground is connected to the gate of the PF2 adjacent to the power source through the intermediary of an overvoltage protection circuit 23 for the gate-source of the PF2 adjacent to the power source, which is constituted by resistors R25 and R26 and a zener diode ZD2. The commonly connected bases of the transistors T2 and T6 are connected to the terminal PO2 for outputting pulse signals through the intermediary of a noise protection filtering circuit 24 formed of resistors R14 and R13 and a capacitor C12.

The transistors T3 and T7, a resistor R21, and a diode D12, and transistors T4 and T8, a resistor R22, and a diode 13 constitute PF drive circuits 25 and 28, respectively, adjacent to the ground. The PF drive circuits 25 and 28 amplify pulse signals for controlling the two PFs adjacent to the ground to an appropriate value of the power supply voltage Vcc or less, basically to the gate-source (ground) voltage value at which the PF3 and PF4 adjacent to the ground can be turned ON.

To be more specific, in the PF drive circuit 25 adjacent to the ground, the transistors T3 and T7 connected in series in the forward direction through the intermediary of a resistor R21 are interposed between the DC power source Vcc and the ground. In this case, the bases of the two transistors T3 and T7 are commonly connected to a terminal PO3 for outputting pulse signals for controlling the PF1 adjacent to the ground of the logic circuit 17c. The end of the resistor R21 that is adjacent to the ground, i.e., the point between the resistor R21 and the emitter of the transistor T7, is connected to the gate of the PF3 adjacent to the ground.

In this embodiment, the end of the resistor R21 that is adjacent to the ground is connected to the gate of the PF3 adjacent to the ground through the intermediary of an overvoltage protection circuit 26 for the gate-source of the PF3 adjacent to the ground, which is constituted by resistors R27 and R28 and a zener diode ZD3. The commonly connected bases of the transistors T3 and T7 are connected to the terminal PO3 for outputting pulse signals through the intermediary of a noise protection filtering circuit 27 formed of resistors R16 and R15 and a capacitor C13. The DC power source Vcc is connected to the collector of a transistor T3 through the intermediary of a forward diode D12.

In a PF drive circuit 28 adjacent to the ground, transistors T4 and T8 connected in series in the forward direction through the intermediary of a resistor R22 are interposed between the DC power source Vcc and the ground. In this case, the bases of the two transistors T4 and T8 are commonly connected to a terminal PO4 for outputting pulse signals for controlling the PF4 adjacent to the ground of the logic circuit 17d. The end of the resistor R22 that is adjacent to the ground, i.e., the point between the resistor R22 and the emitter of the transistor T8, is connected to the gate of the PF4 adjacent to the ground.

In this embodiment, the end of the resistor R22 that is adjacent to the ground is connected to the gate of the PF4 adjacent to the ground through the intermediary of an overvoltage protection circuit 29 for the gate-source of the PF4 adjacent to the ground, which is constituted by resistors R29 and R30 and a zener diode ZD4. The commonly connected bases of the transistors T4 and T8 are connected to the terminal PO4 for outputting pulse signals through the intermediary of a noise protection filtering circuit 30 formed of resistors R18 and R17 and a capacitor C14. The DC power source Vcc is connected to the collector of a transistor T4 through the intermediary of a forward diode D13.

The operation of the foregoing circuit in accordance with the present invention will now be described.

Based on signals x, y, and z similar to those shown in FIG. 3, the logic circuit 17 (17a through 17d) outputs signals (voltage waveforms) similar to the signals output from the dedicated IC1 and IC2 shown in FIG. 3 to the pulse signal output terminals PO1 through PO4.

To be more specific, signals similar to pulse signals HO of the dedicated IC1 are supplied to the pulse signal output terminal PO1, and signals similar to pulse signals LO are supplied to the pulse signal output terminal PO3.

Furthermore, signals similar to the pulse signals HO of the dedicated IC2 are supplied to the pulse signal output terminal PO2, and signals similar to the pulse signals LO are supplied to the pulse signal output terminal PO4.

The pulse signals output to the pulse signal output terminals PO1 and PO2 are amplified to a voltage level (high voltage level), at which the PF1 and PF2 adjacent to the power source can be turned ON, by the PF drive circuits 19 and 22 adjacent to the power source that receive the step-up voltage VB from the charge pump circuit 18 as their operating power sources. The amplified pulse signals are supplied to the gates of the PF1 and PF2 adjacent to the power source.

The pulse signals output to the pulse signal output terminals PO3 and PO4 are amplified to a voltage level (low voltage level), at which the PF3 and PF4 adjacent to the ground can be turned ON, by the PF drive circuits 25 and 28 adjacent to the ground that receive a voltage of the power supply voltage Vcc or less (the power supply voltage Vcc in this case) as their operating power sources. The amplified pulse signals are supplied to the gates of the PF3 and PF4 adjacent to the ground.

It is assumed that a normal rotation mode is set when the coil L1 is energized from the left end toward the right end in the drawing (a ventilation mode when the motor is applied to a fan motor) and that a 100% duty ratio is set in this direction. In other words, it is assumed that signals for running at a maximum speed are being output from the logic circuit 17 (17a through 17d) to the pulse signal output terminals PO1 through PO4. In this case, high-level pulse signals are being supplied to the pulse signal output terminals PO1 and PO4, while low-level pulse signals are being supplied to the pulse signal output terminals PO2 and PO3.

At this time, a high-level pulse signal to the pulse signal output terminal PO1 is supplied to the PF drive circuit 19 adjacent to the power source to turn ON the NPN transistor T1 thereof. The high-level pulse signal is amplified to a high-voltage level of the power supply voltage Vcc or more before it is supplied to the gate of the PF1 to turn the PF1 ON.

The high-level pulse signal to the pulse signal output terminal PO4 is supplied to the PF drive circuit 28 adjacent to the ground to turn ON the NPN transistor T4 thereof. The high-level pulse signal is amplified to a low-voltage level of the power supply voltage Vcc or less that is sufficient to turn the PF4 ON (amplification factor 1 is included in this case). The amplified pulse signal is then supplied to the gate of the PF4 to turn the PF4 ON.

Meanwhile, low-level signals are being output to the pulse signal output terminals PO2 and PO3, placing the PF drive circuits 22 and 25 in an inactive mode wherein the transistors T2 and T3 are both OFF over the full period.

Thus, current I from the DC power source Vcc passes along a route of the diode D31, the PF1 (drain-source), the coil L1, the PF4 (drain-source), and the ground in this order, as indicated by a solid-line arrow I, for each high-level duration of the pulse signal to the pulse signal output terminals PO1 and PO4. The rise and fall of the turning ON of the PF1 and PF4 are always simultaneous as long as the duty ratio is set to 100%, and the motor (the rotor) runs at the maximum speed. This means that, when the motor is applied to a fan motor, maximum ventilation is performed to exhaust the heat in the cabinet of electronic equipment provided with the fan motor to the outside at a maximum capacity.

The rise and fall timings of the pulse signals supplied to the pulse signal output terminals PO1 and PO4 are based on the rotational position signal x of the motor (the rotor or the permanent magnet) that is detected by a Hall device or the like (not shown).

If the motor runs at a duty ratio below 100%, e.g., at 50% speed, then only the falling timing of the pulse signal supplied to the pulse signal output terminal PO4 will be advanced by a half, as compared with the timing when the duty ratio is 100%. In other words, the high-level duration of the pulse signal supplied to the pulse signal output terminal PO4 is reduced by half without causing a change in the high-level duration of the pulse signal supplied to the pulse signal output terminal PO1.

Thus, the duration in which the current from the DC power source Vcc passes along the route of the diode D31, the PF1 (drain-source), the coil L1, the PF4 (drain-source), and the ground in this order will be the half the duration at the above 100% duty ratio. The motor, therefore, runs at half the maximum speed.

During the ON period of the PF1, which is longer than the ON period of the PF4, that is, during the period in which only the PF1 is ON while the PF4 is OFF, current I' from the coil L1 is absorbed by a capacitor C3 through the parasitic diode of the PF2, as indicated by a dash-line arrow I'. The electric charges absorbed by the capacitor C3 will be released when the PF1 is turned ON next.

The diode D31 serves as a backflow blocker for blocking the current from the coil L1 from flowing toward the DC power source Vcc. The capacitor C3 functions also as a noise remover.

If the high-level pulse signals are supplied to the pulse signal output terminals PO2 and PO3, while the low-level signals are supplied to the pulse signal output terminals PO1 and PO4, then the PF1 and the PF4 turn OFF, while the PF2 and the PF3 turn ON. This causes the coil L1 to be energized from the right end toward the left end in the drawing, and the motor runs in the reverse direction. When the motor runs in the reverse direction, the PF2 and the PF3 operate in the same manner as the PF1 and the PF4 operate when the motor runs in the normal direction. The coil L1 is energized at a predetermined duty ratio based on the pulse signals x, y, and z supplied to the pulse signal output terminals PO2 and PO3 so as to rotate the motor.

Figure 2:
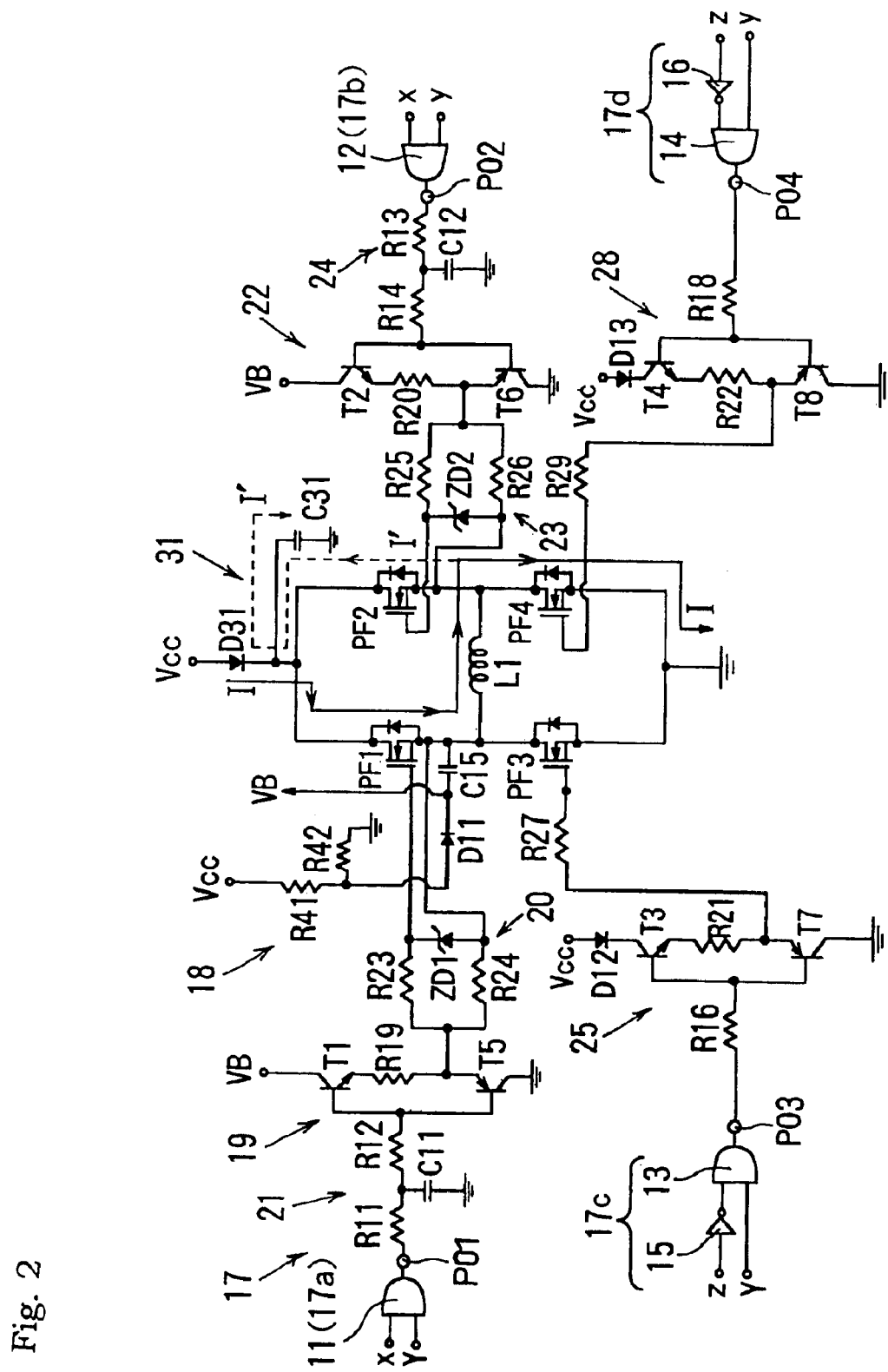
FIG. 2 is a circuit diagram showing another embodiment in accordance with the present invention.

FIG. 2 is a circuit diagram showing another embodiment of the present invention.

In FIG. 2, the same or equivalent components as or to the components shown in FIG. 1 will be assigned the same reference numerals. This embodiment is obtained by removing the overvoltage protection circuits 26 and 29 and the noise protection filtering circuits 27 and 30 from the circuit shown in FIG. 1.

A lower voltage is applied to the gates of the PF3 and PF4 adjacent to the ground, and it is less likely for an overvoltage to be developed between the gates and sources. Hence, the overvoltage protection circuits 26 and 29 may be omitted. There are less noises at the pulse signal output terminals PO3 and PO4, so that the noise protection filtering circuits 27 and 30 may be also omitted.

In the above embodiments, the n-channel MOS power FETs have been used as the switching devices; however, the present invention is not limited thereto. Alternatively, for example, power transistors may be used, in which diodes are in antiparallel connection between the collectors and emitters thereof.

The charge pump circuits have been used as the step-up circuits for supplying voltages exceeding the power supply voltage to the switching device drive circuits adjacent to the power source. Alternatively, however, bootstrap circuits or the like may be used.

Thus, the present invention provides the following advantages. The circuit equivalent to the dedicated ICs in the conventional circuit has been configured using mere logic circuits, such as AND circuits, OR circuits, and inverter circuits (the AND circuits and the inverter circuits in the above embodiments). This permits the use of circuit elements, such as transistors and diodes, and inexpensive circuits, such as general-purpose ICs, making the circuits to be configured at lower cost.

Furthermore, the switching device drive circuit has been connected to the output terminal of such a logic circuit. More specifically, the switching device drive circuit has been configured separately and independently from the logic circuit, and connected to the logic circuit. If the logic circuit is constituted by a general IC, then the switching device drive circuit is externally attached to the logic circuit. This arrangement has eliminated the restrictions that the dedicated IC of the conventional circuit has in the voltage range of the operating power source of the switching device drive circuit, especially the range of the step-up voltage from a step-up circuit applied as the operating power source for the switching device drive circuit adjacent to the power source. Hence, the freedom in circuit designing has been improved, providing flexibility in making various changes, including the change of the motor to be driven. This means that a change of the rated drive voltage of a motor coil or a switching device itself, which involves a change of the control input voltage of the switching device (especially an increase in the control input voltage) can be made without damaging any circuit element.

Moreover, the step-up circuit has been configured using the potentiometer that allows the step-up voltage to be set by setting the resistance value. With this arrangement, a desired step-up voltage based on a control voltage value required to turn ON the two switching devices adjacent to the power source can be easily obtained simply by selecting a resistance value.

Furthermore, the switching device drive circuit adjacent to the power source can be configured using a simple circuit that includes a resistor and an NPN transistor and a PNP transistor connected in series in the forward direction through the intermediary of the resistor.

Similarly, the switching device drive circuit adjacent to the ground can be configured using a simple circuit that includes a resistor and an NPN transistor and a PNP transistor connected in series in the forward direction through the intermediary of the resistor. The configuration of the switching device drive circuit adjacent to the ground is similar to the switching device drive circuit adjacent to the power source; therefore, both switching device drive circuits can be designed and fabricated at the same time, although they require slightly different parameters, such as resistance values. This permits a reduction in cost to be achieved.

In addition, the overvoltage protection circuit has been provided between the control input terminal of the switching device adjacent to the power source and the switching terminal, which is adjacent to the motor coil, of the pair of switching terminals of the switching device. This arrangement makes it possible to protect the switching device adjacent to the power source that is more prone to be subjected to an overvoltage than the switching device adjacent to the ground. Thus, the reliability of the pre-drive circuit can be improved.

What is claimed is:

1. A pre-drive circuit for a brushless DC single-phase motor having a drive circuit in which a pair of series connected units, each series connected unit being constituted by two switching devices, is connected between a power source and the ground, a motor coil connected between the junctions of the two switching devices of the pair of series connected units can be controllably energized/de-energized from any direction at any timing by controlling the turning ON/OFF of the switching devices, a control voltage exceeding a power supply voltage is required to turn ON the two switching devices adjacent to a power source, and a duty ratio of a turning ON/OFF control voltage applied to the switching devices is changed to control the rotational speed of the motor, the pre-drive circuit comprising:

a step-up circuit for boosting a power supply voltage to a predetermined voltage;

a logic circuit for generating and outputting pulse signals for controlling the individual switching devices on the basis of a motor rotational position signal and a duty ratio setting signal for controlling a motor rotational speed;

two switching device drive circuits adjacent to the power source that are respectively connected to pulse signal output terminals for controlling the two switching devices adjacent to the power source of the logic circuit, respectively receive step-up voltages from the step-up circuit as operating power sources, respectively amplify the pulse signals for controlling the two switching devices adjacent to the power source to a predetermined voltage level exceeding the power supply voltage, and respectively supply the amplified pulse signals to control input terminals of the two switching devices adjacent to the power source; and two switching device drive circuits adjacent to the ground that are respectively connected to the pulse signal output terminals for controlling the two switching devices adjacent to the ground of the logic circuit, respectively receive voltages that are the power supply voltage or less as operating power sources, respectively amplify the pulse signals for controlling the two switching devices adjacent to the ground as necessary, and supply the amplified pulse signals to the control input terminals of the two switching devices adjacent to the ground.

2. The pre-drive circuit for a brushless DC single-phase motor according to claim 1, wherein the step-up circuit comprises a potentiometer that allows the step-up voltage to be set by setting a resistance value, and a desired step-up voltage is obtained by setting the resistance value of the potentiometer on the basis of a control voltage value required for turning ON the two switching devices adjacent to the power source.

3. The pre-drive circuit for a brushless DC single-phase motor according to claim 1, wherein the switching device drive circuit adjacent to the power source has a resistor and an NPN transistor and a PNP transistor that are connected in series in a forward direction through the intermediary of the resistor, and the bases of the two transistors are commonly connected to the output terminals of the pulse signals for controlling the switching devices, which are adjacent to the power source, of the logic circuit, while the end of the resistor adjacent to the ground is connected to the control input terminal of the switching device adjacent to the power source.

4. The pre-drive circuit for a brushless DC single-phase motor according to claim 1, wherein the switching device drive circuit adjacent to the ground has a resistor and an NPN transistor and a PNP transistor that are connected in series in a forward direction through the intermediary of the resistor, and the bases of the two transistors are commonly connected to the output terminals of the pulse signals for controlling the switching devices, which are adjacent to the ground, of the logic circuit, while the end of the resistor adjacent to the ground is connected to the control input terminal of the switching device adjacent to the ground.

5. The pre-drive circuit for a brushless DC single-phase motor according to claim 1, further comprising:

an overvoltage protection circuit for restraining an overvoltage between the control input terminal of the switching device adjacent to the power source and the switching end, which is adjacent to a motor coil, of a pair of switching ends of the switching device.

6. The pre-drive circuit for a brushless DC single-phase motor according to claim 2, wherein the switching device drive circuit adjacent to the power source has a resistor and an NPN transistor and a PNP transistor that are connected in series in a forward direction through the intermediary of the resistor, and the bases of the two transistors are commonly connected to the output terminals of the pulse signals for controlling the switching devices, which are adjacent to the power source, of the logic circuit, while the end of the resistor adjacent to the ground is connected to the control input terminal of the switching device adjacent to the power source.

7. The pre-drive circuit for a brushless DC single-phase motor according to claim 2, wherein the switching device drive circuit adjacent to the ground has a resistor and an NPN transistor and a PNP transistor that are connected in series in a forward direction through the intermediary of the resistor, and the bases of the two transistors are commonly connected to the output terminals of the pulse signals for controlling the switching devices, which are adjacent to the ground, of the logic circuit, while the end of the resistor adjacent to the ground is connected to the control input terminal of the switching device adjacent to the ground.

8. The pre-drive circuit for a brushless DC single-phase motor according to claim 3, wherein the switching device drive circuit adjacent to the ground has a resistor and an NPN transistor and a PNP transistor that are connected in series in a forward direction through the intermediary of the resistor, and the bases of the two transistors are commonly connected to the output terminals of the pulse signals for controlling the switching devices, which are adjacent to the ground, of the logic circuit, while the end of the resistor adjacent to the ground is connected to the control input terminal of the switching device adjacent to the ground.

9. The pre-drive circuit for a brushless DC single-phase motor according to claim 2, further comprising:

an overvoltage protection circuit for restraining an overvoltage between the control input terminal of the switching device adjacent to the power source and the switching end, which is adjacent to a motor coil, of a pair of switching ends of the switching device.

10. The pre-drive circuit for a brushless DC single-phase motor according to claim 3, further comprising:

an overvoltage protection circuit for restraining an overvoltage between the control input terminal of the switching device adjacent to the power source and the switching end, which is adjacent to a motor coil, of a pair of switching ends of the switching device.

11. The pre-drive circuit for a brushless DC single-phase motor according to claim 4, further comprising:

an overvoltage protection circuit for restraining an overvoltage between the control input terminal of the switching device adjacent to the power source and the switching end, which is adjacent to a motor coil, of a pair of switching ends of the switching device.

\* \* \* \* \*